(12) United States Patent
Pessolano et al.

(10) Patent No.: US 7,499,831 B2
(45) Date of Patent: Mar. 3, 2009

(54) TIMING CLOSURE MONITORING CIRCUIT AND METHOD

(75) Inventors: Francesco Pessolano, Eindhoven (NL); Bob Bernardus Anthonius Theunissen, Eindhoven (NL)

(73) Assignee: NXP B.V., Eindhoven (NL)

( * ) Notice: Subject to any disclaimer, the term of this patent is extended or adjusted under 35 U.S.C. 154(b) by 291 days.

(21) Appl. No.: 10/560,687

(22) PCT Filed: Jun. 2, 2004

(86) PCT No.: PCT/IB2004/050823

§ 371 (c)(1),
(2), (4) Date: Dec. 14, 2005

(87) PCT Pub. No.: WO2004/111667

PCT Pub. Date: Dec. 23, 2004

(65) Prior Publication Data
US 2006/0187001 A1 Aug. 24, 2006

(30) Foreign Application Priority Data
Jun. 16, 2003 (EP) .................................. 03101753

(51) Int. Cl.
G06F 15/00 (2006.01)
G06F 19/00 (2006.01)

(52) U.S. Cl. ........................ 702/176; 702/177; 702/178; 702/118; 365/201; 326/93

(58) Field of Classification Search ......... 702/176–178, 702/79–81, 89, 107, 117, 118; 365/201; 327/39, 141; 714/746; 326/93, 95, 98
See application file for complete search history.

(56) References Cited

U.S. PATENT DOCUMENTS

| 6,114,880 A * | 9/2000 | Buer et al. ................. 327/39 |
| 7,278,080 B2 * | 10/2007 | Flautner et al. ............. 714/746 |
| 2003/0128606 A1 * | 7/2003 | Chuang et al. ............. 365/201 |

* cited by examiner

Primary Examiner—Eliseo Ramos Feliciano
Assistant Examiner—Phuong Huynh

(57) ABSTRACT

An integrated circuit 1 comprises a timing closure monitoring circuit 2. The timing closure monitoring circuit 2 comprises a duplicate path 19, having the same characteristics as a logic path 3 being monitored. The duplicate path 19 receives a pulsed reference signal 23 from a reference generating unit (RGU) 24. The pulsed reference signal 23 is synchronized with the clock signal 13, and passed through the duplicate path 19 to a reference checking unit (RCU) 25. In a normal mode of operation in which timing closure is guaranteed, the clock signal 13 will sample the pulsed reference signal 23, such that no interrupt signal is generated on the interrupt line 33. However, in the situation where the reference check unit 25 is clocked by the clock signal 13 prior to the pulsed reference signal 23 being received via the duplicate path 19, an interrupt signal is generated on the interrupt line 33, indicating that timing closure cannot be guaranteed.

29 Claims, 4 Drawing Sheets

TIMING CLOSURE MONITORING CIRCUIT AND METHOD

The invention relates to an integrated circuit having a timing closure monitoring circuit, and in particular, to a timing closure monitoring circuit and method for use during normal working conditions of an integrated circuit.

In a standard circuit design flow, timing closure relates to the ability to design a system or module that meets certain speed expectations without flaws being experienced in the behavior of the system. This means that a circuit designer can test a circuit during the design process to ensure that timing violations do not affect the operation of the circuit.

However, with the implementation of circuits and systems in new deep submicron technologies, for example 100 nm technology or beyond, circuit performance can be severely hampered by excessive transistor leakage, by the impact of local and global process variables and by reduced noise margins. To help alleviate such performance degrading properties, strategies have been developed to adapt run-time (i.e. real-time) design parameters. For example, it is possible to manipulate the operating conditions of the system, such as power supply or frequency of operation, so as to obtain a better performance in terms of energy dissipation and/or speed.

Such strategies alter parameters such as threshold voltages, which also affect the timing of each individual gate in the system. By doing so, if not taken into consideration, these strategies can also alter the delay path in the integrated circuit, thus violating timing closure in the system itself. In other words, mechanisms for compensating for run-time process variations can result in logical paths becoming too slow for a given frequency.

The aim of the present invention is to provide an integrated circuit having a timing closure monitoring circuit, and a method which enables timing closure to be monitored during run-time or real-time operation.

According to a first aspect of the invention, there is provided an integrated circuit comprising a timing closure monitoring circuit for monitoring timing closure in a logic path on the integrated circuit, the timing closure monitoring circuit comprising:

a signal generator for generating a predetermined reference signal;

a duplicate logic path having characteristics matched with the logic path being monitored, and connected to receive the reference signal from the signal generator; and monitoring means arranged to receive an output signal from the duplicate logic path, and provide an output signal indicative of the status of the timing closure in the logic path being monitored.

According to a second aspect of the invention, there is provided a method of monitoring timing closure in a logic path on an integrated circuit, the method comprising the steps of:

generating a predetermined reference signal;

providing a duplicate logic path corresponding to the logic path being monitored;

passing the reference signal through the duplicate logic path, and monitoring the output of the duplicate logic path, and using the output of the duplicate logic path to produce an output signal indicative of the status of the timing closure in the logic path being monitored.

For a better understanding of the present invention, and to show more clearly how it may be carried into effect, reference will now be made, by way of example, to the accompanying drawings, in which.

Figure 1:
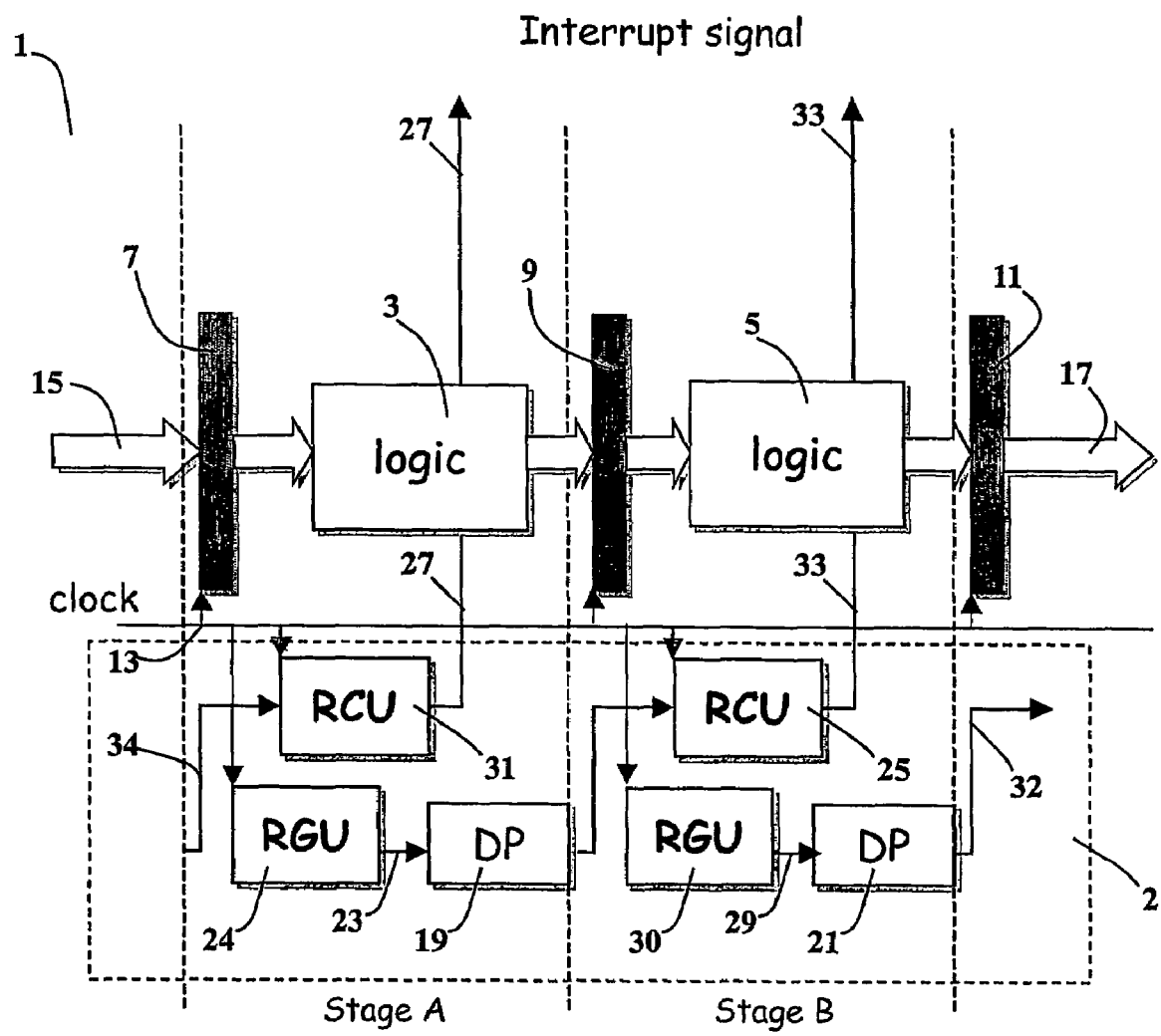
FIG. 1 shows a timing closure monitoring circuit according to a first aspect of the present invention.

FIG. 1 shows an integrated circuit 1 having a timing closure monitoring circuit 2 according to a first aspect of the present invention. The integrated circuit 1 typically comprises a number of logic paths 3, 5 (for example pipeline stages) for connecting various processing units 7, 9, 11 which are clocked by a clock signal 13. A first processing unit 7, for example a logic section such as a bank of flip-flops, receives an input data signal 15, which is passed via pipeline stage 3 to a further processing unit 9, and in turn via pipeline stage 5 to a processing unit 11. The processing unit 11 generates an output data signal 17. As mentioned above, each of the processing units 7, 9, 11 and pipeline stages 3, 5 may be subject to parameter variations during use. The parameter variations can in turn cause timing problems, thereby affecting the processing of the input data signal 15 on route through the pipeline stages 3, 5 and processing units 7, 9, 11.

According to a first aspect of the invention, the worst-case path or critical path for one or more pipeline stages 3, 5 is replicated by a duplicate path having similar characteristics with respect to delay and composition. For example, pipeline stage 3 is replicated by a duplicate path 19. In a similar way, pipeline stage 5 is replicated by a duplicate path 21 having similar characteristics with respect to delay and composition. The duplicate paths 19, 21 are preferably a number of buffering stages having non-inverting outputs, and which have the same number of transistors and delay characteristics of the paths being duplicated.

The duplicate path 19 in stage A of the integrated circuit receives a pulsed reference signal 23 from a reference generating unit (RGU) 24. The pulsed reference signal 23 is synchronized with the clock signal 13. Preferably, the pulsed reference signal 23 is synchronized with a rising edge of the clock signal 23. Alternatively, it will be appreciated that the pulsed reference signal 23 may be synchronized with the falling edge of the clock signal 13, depending upon whether the rising edge or the falling edge of the clock signal is used as the sampling/clocking edge.

The pulsed reference signal 23 is passed through the duplicate path 19 to monitoring means, referred to hereinafter as a reference checking unit (RCU) 25. Preferably the reference checking unit 25 is a latch which is clocked by the clock signal 13. In a normal mode of operation in which timing closure is guaranteed, the clock signal 13 will sample the pulsed reference signal 23, such that no interrupt signal is generated on the interrupt line 33. In other words, if the reference checking unit 25 is clocked after the pulsed reference signal 23 has been received via the duplicate path 19, this means that the duplicate path has not delayed the pulsed reference signal 23 to the extent that timing closure has been violated, and no interrupt signal is generated on the interrupt line 33.

However, in the situation where the reference checking unit 25 is clocked by the clock signal 13 prior to the pulsed reference signal 23 being received via the duplicate path 19, an interrupt signal is generated on the interrupt line 33. In other words, when the reference checking unit 25 is clocked prior to the pulsed reference signal 23 being received, this means that the duplicate path 19 has delayed the pulsed reference signal 23 to the extent that timing closure cannot be guaranteed, causing an interrupt signal to be generated on the interrupt line 33.

In a similar manner, in stage B of the integrated circuit, a reference generating unit 30 generates a pulsed reference signal 29 which is synchronized with the clock signal 13. The pulsed reference signal 29 is passed through the duplicate path 21. The output 32 of the duplicate path 21 is passed to a reference check unit in a further stage (not shown). Likewise, the reference checking unit 31 in stage A receives a pulsed reference signal 34 from a duplicate path in a previous stage (not shown). As before, if the reference checking unit 31 is clocked after receipt of the pulsed reference signal 34 from the previous section, no interrupt signal is generated on the interrupt line 27. However, if the reference checking unit 31 is clocked prior to receipt of the pulsed reference signal 34, an interrupt signal 27 is generated to warn that timing closure has been violated, or that timing closure cannot be guaranteed.

Thus, the integrated circuit shown in FIG. 1 comprises a timing closure monitoring circuit for one or more pipeline stages of the integrated circuit, with an individual interrupt signal 27, 33 being generated for each pipeline stage when timing closure has been violated, or when timing closure violation is expected, or cannot be guaranteed.

The invention has the advantage of enabling timing closure to be monitored dynamically in real-time, thereby avoiding potential timing problems that can arise when design parameters of the integrated circuit are changed.

The firing of an interrupt via the interrupt signals 27, 33 can be used to activate a safety mechanism. In the embodiment of FIG. 1, the generation of an interrupt signal is instantaneous, since each pipeline stage has a sampling point which is directly coupled to an interrupt handler.

It is noted that, although the reference checking unit 25 is positioned in a different pipelined stage to the duplicate path 19 being monitored, alternatively, the circuit could be arranged such that the input to reference checking unit 31 in stage A is connected to receive the output of the duplicate path 19 in stage A, thereby confining the reference checking unit 31, the reference generating unit 24 and duplicate path 19 within the same pipelined stage. In a similar manner, the output from duplicate path 21 in stage B could be connected to the input of the reference checking unit 25 in stage B.

Figure 2:
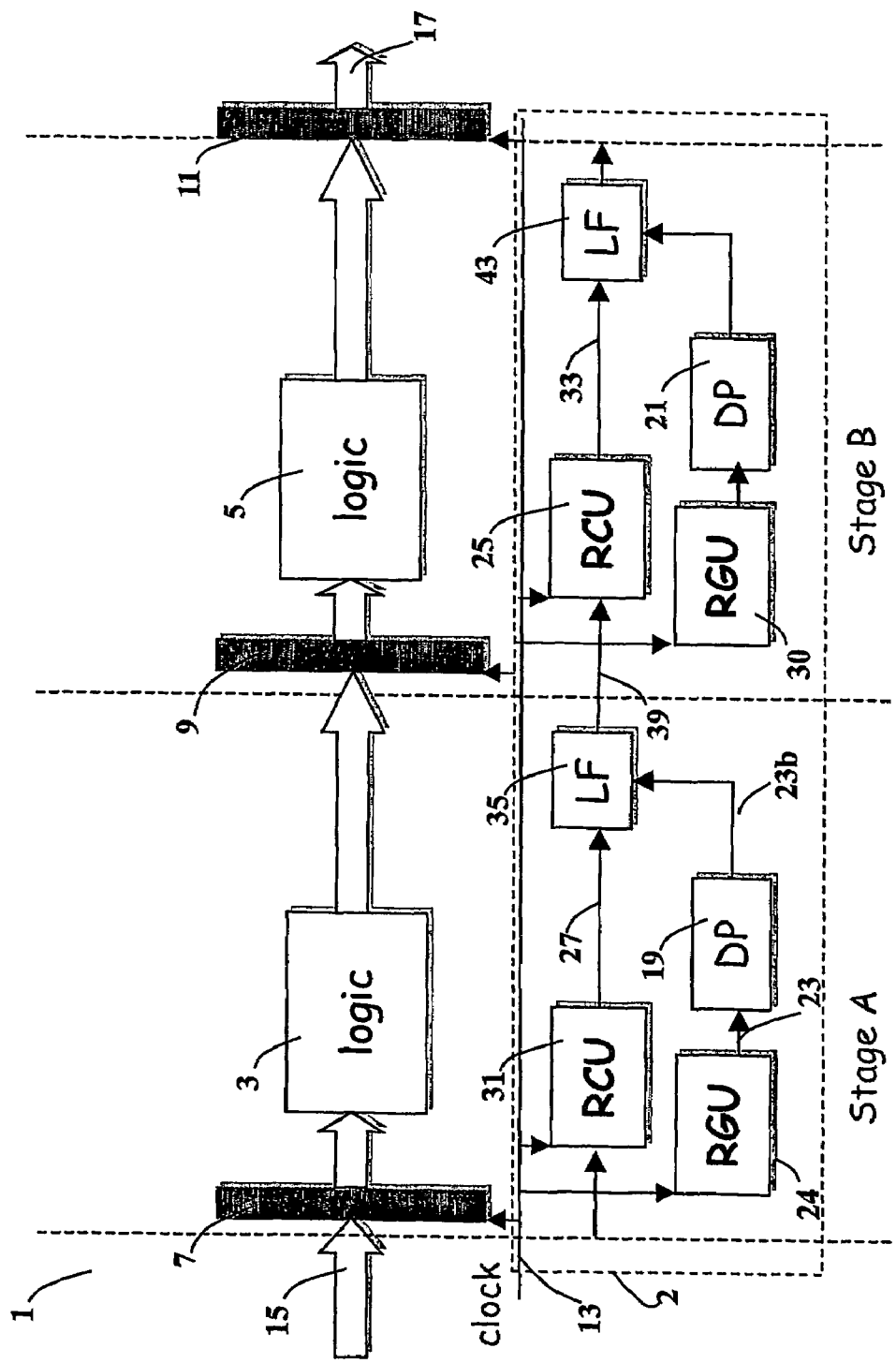
FIG. 2 shows a timing closure monitoring circuit according to a second aspect of the present invention.

FIG. 2 shows an alternative embodiment, in which the interrupt signal is fed between one pipeline stage and another, thereby providing a serial interrupt signal rather than a number of separate interrupt signals in parallel. As with FIG. 1 above, the integrated circuit 1 comprises a number of logic paths 3, 5 (for example pipeline stages) for connecting various processing units 7, 9, 11, which are clocked by a clock signal 13. The logic path 3 is replicated by a duplicate path 19, while logic path 5 is replicated by a duplicate path 21. The duplicate paths 19, 21 have similar characteristics with respect to delay and composition as their respective logic paths 3, 5.

The duplicate path 19 receives a pulsed input reference signal 23 from a reference generating unit (RGU) 24. The pulsed reference signal 23 is synchronized with the clock signal 13. Preferably, the pulsed reference signal 23 is synchronized with a rising edge of the clock signal 23. The pulsed reference signal 23 is passed through the duplicate path 19, and the output 23b is connected to a logic function unit 35. In addition to receiving the pulsed reference signal 23b (i.e. after passing through the duplicate path 19), the logic function unit 35 also receives an interrupt signal 27 generated by a reference checking unit 31. The status of the interrupt signal 27 depends upon the status of the timing closure monitoring circuit of the previous stage. The output signal 39 of the logic function unit 35 is connected to a reference checking unit 25. An interrupt signal 33 is generated at the output of the reference checking unit 25 in the following situations. First, if an interrupt signal 27 has been generated by the previous stage of the integrated circuit, the logic function unit 35 produces an output signal 39, which in turn causes the reference checking unit 25 to generate an interrupt signal 33 when the reference checking unit 25 is clocked by the clock signal 13. In other words, in this situation an interrupt signal 27 propagates regardless of the status of the pulsed reference signal 23b.

However, when the interrupt signal 27 indicates that no timing closure violation is present in the preceding stage, then the output of the reference checking unit 25 depends upon the status of the pulsed reference signal 23b. As with FIG. 1, if the reference checking unit 25 is clocked after receipt of the pulsed reference signal 23 via the duplicate path 19 and the logic function unit 35, then no interrupt signal 33 is generated. On the other hand, if the reference checking unit 25 is clocked prior to the pulsed reference signal 23 being received via the duplicate path 19 and the logic function unit 35, this means that the duplicate path has delayed the pulsed reference signal 23 to the extent that timing closure cannot be guaranteed, thus generating an interrupt signal 33.

From the above, it can be seen that the embodiment of FIG. 2 provides a serial interrupt signal which propagates through two or more stages of the integrated circuit.

Each time a timing closure violation is expected or detected, this event is reported as an interrupt signal to either the running application or a controller, depending on the configuration of the system. For example, in a system with power management software, an interrupt would be generated so as to allow the software to take proper actions due to timing closure violations.

Figure 3:
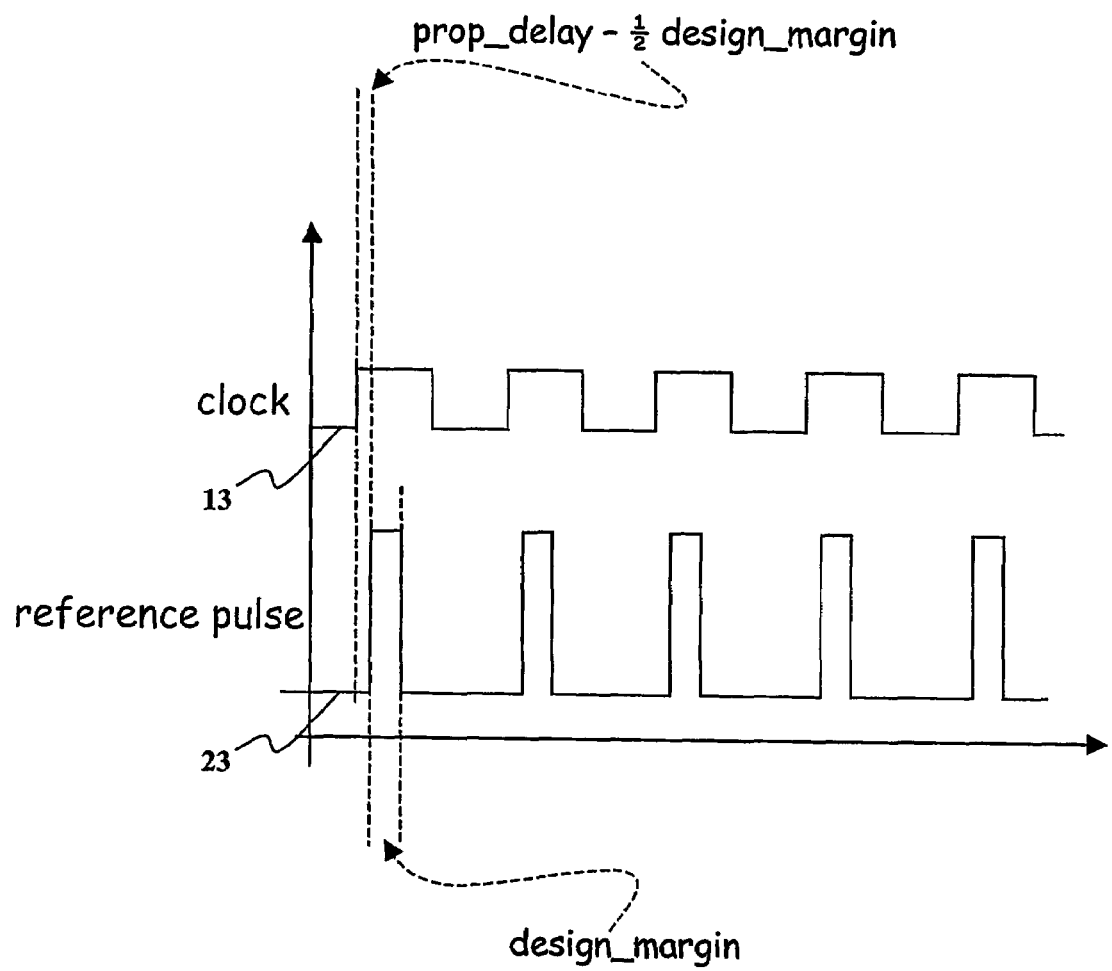
FIG. 3 shows a timing diagram of the reference pulse used in the timing closure monitoring circuits of FIGS. 1 and 2.

FIG. 3 shows further details of the timing of the pulsed reference signal 23 used in the duplicate path, in comparison with the clock signal 13. The Fig. shows that the rising edge of the pulsed reference signal 23 is delayed from the rising edge of the clock signal by a predetermined period. Preferably, the predetermined period is equal to:

$$\text{prop\_delay} - \tfrac{1}{2}\text{design\_margin}$$

In other words, the pulsed reference signal 23 is delayed with respect to the clock signal 13 by a period equal to the propagation delay of the processing unit driving the logic path, minus half the design margin. For example, if the processing units 7, 9, 11 are flip-flops, the propagation delay between an even occurring on the input CK of a flip-flop (Dff) until an event can be observed at the output Q is taken as the propagation delay (i.e. CK2Q_Dff).

The pulse width of the reference pulse is preferably equal to the design margin. For example, for safe and normal speed designs the design margin can be up to 15 to 20% of the clock cycle. Alternatively, for aggressive design the width of the pulsed reference signal 23 can be reduced to between 3 to 4% of the clock cycle. It will be appreciated that the latter will only detect timing closure in extreme circumstances. The design margin also includes constraints relating to the set-up time of flip-flops in the processing units 7, 9 and 11.

It is noted that, although the preferred embodiment uses a standard reference pulse, other forms of reference pulse can also be used.

Figure 4:
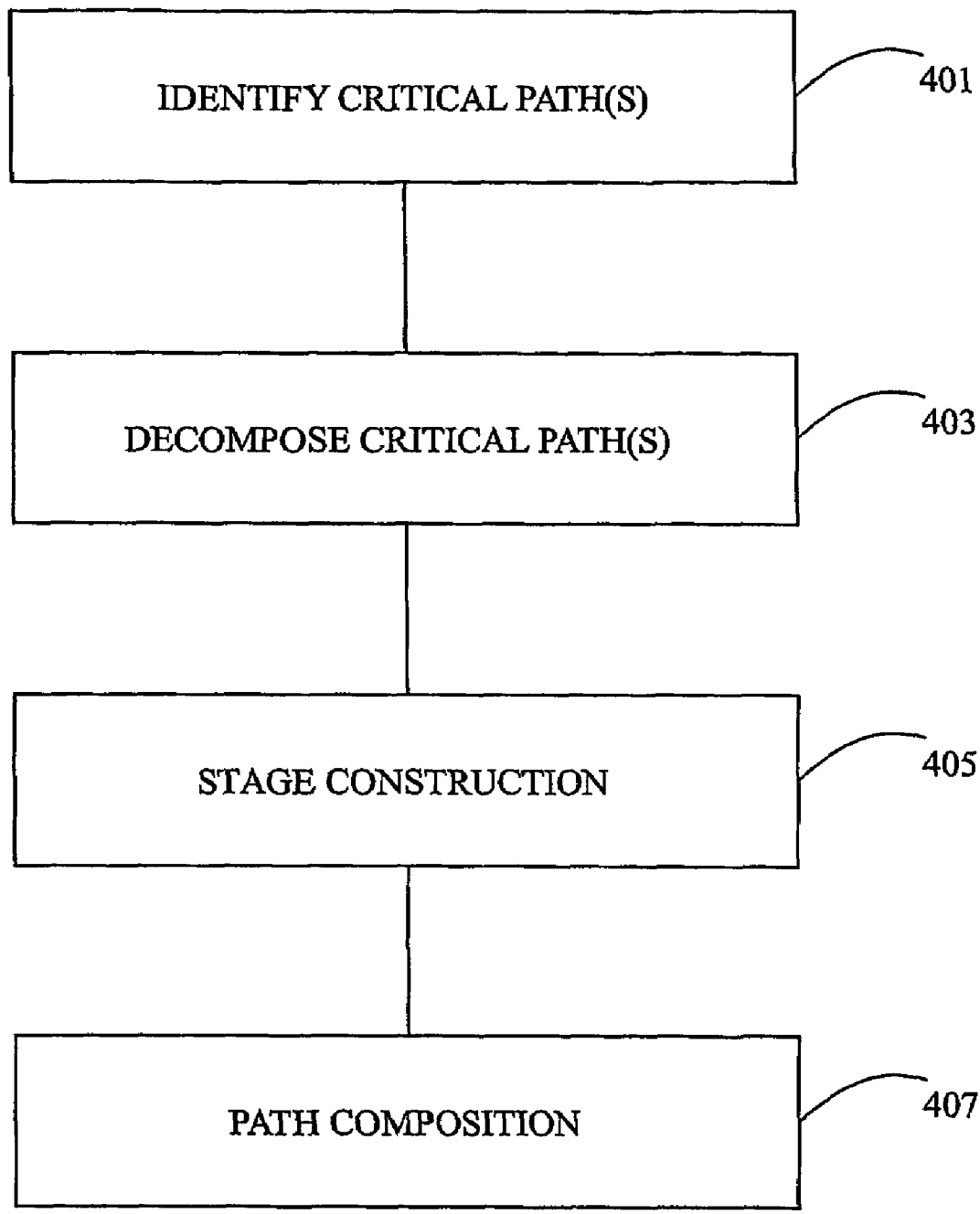
FIG. 4 shows a flowchart describing how a critical path may be determined.

FIG. 4 shows the steps involved in determining the critical path according to the preferred embodiment of the invention.

In step 401, the system identifies critical paths between processing units, for example critical paths between banks of flip-flops. This step is carried out for one or more pipeline stages in the integrated circuit. Although this step is complex, it is usually supported by standard design methodologies, which provide designers with a complete description of the worse possible critical paths in the design. Preferably, such paths must not include the flip-flops at the boundary. Next, the critical path is decomposed, step 403. This involves decomposing the path into buffering stages, i.e. stages that do not produce inverted outputs. Each stage is characterized in delay and transistor number. Each stage is then constructed, step 405. This involves replacing each of the stages determined in step 403 with a buffer which is constructed to have the same number of transistors and delay (and physically similar area). Next, the path is composed, step 407. This involves replicating the critical path using the buffers constructed in step 405. As a result, the duplicate path will have a very similar behavior with respect to the original path when working conditions are modified.

The provision of a duplicate path according to the invention allows timing closure to be monitored and corrective action to be taken if timing violation occurs.

It is noted that although the preferred embodiment refers to having a duplicate path in each pipeline stage, it will be appreciated that the duplicate path can be used in just certain pipeline stages. For example, the use of duplicate paths could be limited to pipeline stages in which timing errors or problems are envisaged during the design procedure.

In addition, although the preferred embodiments show the use of parallel and ; |s, respectively, it is noted that these can be used in combination at different locations or stages on the same integrated circuit. For example, an integrated circuit could have parallel interrupt signals generated by pipeline stages in which timing problems are likely to occur, and single serial interrupt signal generated for a number of pipeline stages in which timing problems are less likely to occur.

Furthermore, although the duplicate path is preferably comprised of buffer stages having the same characteristics as the path being replicated, it is noted that other gates could be used, providing they have the same characteristics as the original path. In addition, the duplicate path can comprise the exact same components as the original path, although this will result in greater design complexity and a wasteful use of area.

The invention described above provides a timing closure monitoring circuit for an integrated circuit that enables timing closure, or the likelihood of timing closure, to be determined dynamically during working conditions of the integrated circuit. The circuit is particularly suited for use in integrated circuits in which circuit parameters are altered during use to compensate for variations in environmental conditions.

The invention claimed is:

1. An integrated circuit comprising:
   a logic path that is clocked by a clock signal; and
   a timing closure monitoring circuit for monitoring timing closure in the logic path, the timing closure monitoring circuit including:
      a signal generator for generating a predetermined reference signal;
      a duplicate logic path having timing characteristics matched with the logic path being monitored, and connected to receive the reference signal from the signal generator; and
      a monitoring circuit arranged to receive an output signal from the duplicate logic path, to compare receipt of the output signal relative to receipt of the clock signal, and to provide a timing closure signal indicative of the status of the timing closure in the logic path being monitored responsive to comparing the receipt of the output signal relative to receipt of the clock signal.

2. An integrated circuit as claimed in claim 1, wherein the timing closure signal indicates a timing closure violation when the output signal of the duplicate logic path is delayed by a predetermined amount, and further comprising:
   a first pipeline stage that includes the logic path being monitored;
   a second pipeline stage that includes another logic path that is clocked by the clock signal, the first and second pipeline stages being serially connected,
   wherein the timing closure monitoring circuit is configured and arranged to monitor timing closure in the other logic path being monitored, and the timing closure monitoring circuit further includes:
      another signal generator for generating another predetermined reference signal;
      another duplicate logic path having timing characteristics matched with the other logic path being monitored, and connected to receive the other reference signal from the other signal generator; and
      another monitoring circuit arranged to receive an output signal from the other duplicate logic path, to compare receipt of the output signal from the other duplicate logic path relative to receipt of the clock signal, and to provide another timing closure signal indicative of the status of the timing closure in the other logic path being monitored responsive to comparing the receipt of the output signal from the other duplicate logic path relative to receipt of the clock signal.

3. An integrated circuit as claimed in claim 1, wherein the clock signal is used by the signal generator to generate the reference signal, and wherein the timing closure signal indicates a timing closure violation when the output signal of the duplicate logic path is received by the monitoring circuit after the monitoring circuit receives a next leading edge of the clock signal.

4. An integrated circuit as claimed in claim 3, wherein the reference signal produced by the signal generator is synchronized with the clock signal.

5. An integrated circuit as claimed in claim 4, wherein the reference signal is synchronized with the leading edge of the clock signal.

6. An integrated circuit as claimed in claim 3, wherein the reference signal produced by the signal generator is delayed with respect to the clock signal.

7. An integrated circuit as claimed in claim 6, wherein the reference signal is delayed with respect to the clock signal by an amount equal to (prop_delay)−(½ design_margin), where prop_delay is the propagation delay of a processing unit driving the logic path, and the design margin relates to the sensitivity of the circuit for detecting timing closure.

8. An integrated circuit as claimed in claim 1, wherein the signal generator is configured to generate a reference signal having a pulse width that is predetermined according to a design margin.

9. An integrated circuit as claimed in claim 8, wherein the design margin determines the sensitivity of the timing closure monitoring circuit for detecting timing closure violation.

10. An integrated circuit as claimed in claim 1, wherein the duplicate logic path is configured to match the delay and/or composition characteristics of the logic path being monitored.

11. An integrated circuit as claimed in claim 10, wherein the duplicate logic path includes one or more buffer stages for matching the characteristics of the logic path being monitored.

12. An integrated circuit as claimed in claim 11, wherein the one or more buffer stages comprise the same number of switching gates as the logic path being monitored.

13. An integrated circuit as claimed in claim 2, wherein at least one of the timing closure violation signals is used to generate an interrupt signal.

14. An integrated circuit as claimed in claim 2, wherein the timing closure violation signal provided by the monitoring circuit is supplied to the other monitoring circuit, the monitoring circuits are configured and arranged to generate a serial interrupt signal.

15. An integrated circuit as claimed in claim 2, wherein the first pipeline stage includes a plurality of logic paths and the logic path being monitored is a critical path of the first pipeline stage, and the second pipeline stage includes a plurality of logic paths and the other logic path being monitored is a critical path of the second pipeline stage.

16. An integrated circuit as claimed in claim 1, having one or more further timing closure monitoring circuits, for monitoring timing closure in one or more further logic paths on the integrated circuit.

17. An integrated circuit as claimed in claim 1, wherein the monitoring circuit includes a latch.

18. An integrated circuit as claimed in claim 1, wherein the timing closure signal is used to control the timing closure in the logic path being monitored.

19. A method of monitoring timing closure in a logic path on an integrated circuit, the logic path being clocked by a clock signal, the method comprising:
generating a predetermined reference signal;
providing a duplicate logic path corresponding to the logic path being monitored;
passing the reference signal through the duplicate logic path, and
monitoring receipt of the output of the duplicate logic path relative to receipt of the clock signal, and using the output of the duplicate logic path to produce a timing closure signal indicative of the status of the timing closure in the logic path being monitored based on the monitoring of the receipt of the output of the duplicate logic path relative to the receipt of the clock signal.

20. A method as claimed in claim 19, wherein the timing closure signal indicates a timing closure violation when the output of the duplicate logic path is delayed by a predetermined amount, and wherein the integrated circuit includes a first pipeline stage that includes the logic path being monitored and a second pipeline stage that includes another logic path that is clocked by the clock signal, the pipeline stages being serially connected, the method further comprising monitoring timing closure in the other logic path by
generating another predetermined reference signal;
providing another duplicate logic path corresponding to the other logic path being monitored;
passing the other reference signal through the other duplicate logic path, and
monitoring receipt of the output of the other duplicate logic path relative to receipt of the clock signal, and using the output of the other duplicate logic path to produce another timing closure signal indicative of the status of the timing closure in the other logic path being monitored based on the monitoring of the receipt of the output of the other duplicate logic path relative to the receipt of the clock signal.

21. A method as claimed in claim 19, wherein the clock signal is used to generate the reference signal, and wherein the timing closure signal indicates a timing closure violation when a next leading edge of the clock signal precedes the output of the duplicate logic path.

22. A method as claimed in claim 21, wherein the reference signal is synchronized with the clock signal.

23. A method as claimed in claim 22, wherein the reference signal is delayed with respect to the clock signal.

24. A method as claimed in claim 23, wherein the reference signal is delayed with respect to the clock signal by an amount equal to (prop-delay)−(½ design_margin), where prop_delay is the propagation delay of a processing unit driving the logic path, and the design margin relates to the sensitivity of the circuit for detecting timing closure.

25. A method as claimed in claim 19, wherein the pulse width of the reference signal is chosen according to a predetermined design margin.

26. A method as claimed in claim 25, wherein the design margin relates to the sensitivity of the timing closure monitoring circuit for detecting timing closure violation.

27. A method as claimed in claim 19, wherein the duplicate logic path is configured to match the delay and/or composition characteristics of the logic path being monitored.

28. A method as claimed in any claim 19, wherein the logic path being monitored is a critical path in the integrated circuit.

29. A method as claimed in claim 19, wherein the logic path being monitored is part of a pipeline stage that includes a plurality of logic paths and the logic path being monitored is a critical path of the pipeline stage, and wherein the step of providing the duplicate logic path includes:
identifying the critical logic path in the pipeline stage;
decomposing the critical path into one or more stages;
constructing buffer stages corresponding to the stages identified in the decomposing step, the buffer stages being constructed to have the same characteristics as the stages of the critical path; and
composing the duplicate path using the buffer stages constructed in the constructing step.

* * * * *